(12) United States Patent
Alaoui et al.

(10) Patent No.: US 11,397,863 B2
(45) Date of Patent: Jul. 26, 2022

(54) MAGNETIC READER SENSOR DEVICE FOR READING MAGNETIC STRIPES AND METHOD FOR MANUFACTURING THE SENSOR DEVICE

(71) Applicant: Crocus Technology SA, Grenoble (FR)

(72) Inventors: Ali Alaoui, Lyons (FR); Jeffrey Childress, San Jose, CA (US); Hakan Ates Gurcan, Los Gatos, CA (US)

(73) Assignee: CROCUS TECHNOLOGY SA, Grenoble (FR)

(*) Notice: Subject to any disclaimer, the term of this patent is extended or adjusted under 35 U.S.C. 154(b) by 0 days.

(21) Appl. No.: 16/724,482

(22) Filed: Dec. 23, 2019

(65) Prior Publication Data

US 2020/0202082 A1 Jun. 25, 2020

(30) Foreign Application Priority Data

Dec. 24, 2018 (EP) .................................... 18315053

(51) Int. Cl.
*G06K 7/08* (2006.01)
*G06K 19/06* (2006.01)
(Continued)

(52) U.S. Cl.
CPC ............. *G06K 7/084* (2013.01); *G06K 7/087* (2013.01); *G06K 19/06196* (2013.01);
(Continued)

(58) Field of Classification Search
CPC ........ G06K 7/082; G06K 7/084; G06K 7/087; G06K 19/06206; H01L 43/02;
(Continued)

(56) References Cited

U.S. PATENT DOCUMENTS 9,018,028 B2 * 4/2015 Ryu .................... G01R 33/0011
438/48
9,857,437 B2 * 1/2018 Taylor ................ G01R 33/0052
(Continued)

FOREIGN PATENT DOCUMENTS

EP 1521244 A1 4/2005

OTHER PUBLICATIONS

Bares, J. A., Sumant, A. V., Grierson, D. S., Carpick, R. W., & Sridharan, K. (2007). Small amplitude reciprocating wear performance of diamond-like carbon films: Dependence of film composition and counterface material. Tribology Letters, 27(1), 79-88. doi:http://dx.doi.org/10.1007/s11249-007-9209-x (Year: 2007).*

(Continued)

*Primary Examiner* — Thien M Le
*Assistant Examiner* — April A Taylor
(74) *Attorney, Agent, or Firm* — Pearne & Gordon LLP

(57) ABSTRACT

The present disclosure concerns a magnetic reader (MR) sensor device for reading magnetic stripes, the MR sensor device comprising a substrate provided on a wafer, a back-end-of-line (BEOL) interconnect layer and a plurality of magneto-resistive sensor elements embedded within the BEOL interconnect layer; the MR sensor device comprising a protective layer having a Vickers hardness of at least 3 GPa. The present disclosure further concerns a method for manufacturing the MR sensor device. The MR sensor device can be brought close to the surface to the magnetic stripe so that the magnetic stripe can be read with an increased resolution.

21 Claims, 5 Drawing Sheets

(51) Int. Cl.
*H01L 43/02* (2006.01)
*H01L 43/12* (2006.01)

(52) U.S. Cl.
CPC ........ *G06K 19/06206* (2013.01); *H01L 43/02* (2013.01); *H01L 43/12* (2013.01)

(58) Field of Classification Search
CPC ... H01L 43/12; G01R 33/0011; G01R 33/072; G01R 33/096; G01R 33/093; G01R 33/098; G01R 33/0094; G01R 33/091; G01R 33/0052
See application file for complete search history.

(56) References Cited

U.S. PATENT DOCUMENTS

| | | | |
|---|---|---|---|
| 9,917,137 B1* | 3/2018 | Briggs | .................... H01L 43/02 |
| 2006/0171081 A1 | 8/2006 | Breuer et al. | |
| 2013/0228622 A1 | 9/2013 | Hopt et al. | |
| 2014/0263646 A1 | 9/2014 | Manesh | |
| 2019/0101600 A1* | 4/2019 | Isler | .................... G01R 33/096 |

OTHER PUBLICATIONS

Search Report issued in European Patent Application No. 19210976.7 dated Apr. 17, 2020.

\* cited by examiner

MAGNETIC READER SENSOR DEVICE FOR READING MAGNETIC STRIPES AND METHOD FOR MANUFACTURING THE SENSOR DEVICE

FIELD

The present disclosure concerns a magnetic stripe reader sensor device comprising magneto-resistive sensor elements, for reading magnetic stripes. The present disclosure further concerns a method for manufacturing the magnetic stripe reader sensor device.

DESCRIPTION OF RELATED ART

Magnetic stripes are typically found in credit and debit cards, gift cards, hotel keycards, membership and loyalty cards. These magnetic stripes are used to store information typically related to the card holder. Data can be stored on these magnetic stripes using standard international specifications or custom protocols.

A magnetic stripe is composed of a multitude of small magnetic elements that can be programmed by switching their magnetization. Typically credit cards can store 75 bits per inch or 210 bits per inch depending on the track. The number of bits per inch relates to the width (or pitch) of the magnetic elements that constitute the track on the stripe. Magnetic stripes can also be found in cassettes and long-term storage devices such as hard drives.

FIG. 1 is a cross section view of a magnetic stripe 100 showing how the magnetic fields 101 generated by each magnetic element 102 of the magnetic stripe propagate.

Typically, to extract information from the magnetic stripe, a magnetic reader head (MRH) is used. The MRH typically comprises a coil, usually made of copper, a ferrite core, usually made of stacked sheets of iron (Fe), and aluminum housing. The MRH may also be based on magnetoresistive sensors.

The small size of the magnetic elements 102 requires the magnetic reader to be very close to the magnetic stripe to selectively sense the magnetic fields generated by each magnet. This is referred to as resolution. A high resolution magnetic reader sensor will pick up every magnetic field, whereas a low resolution magnetic reader sensor will pick up the sum of magnetic fields emitted by more than a single magnet element on the stripe.

According to the ISO 7811-4 standard, track 1 that holds the credit card number, expiration date and card holder full name is 210 bits per inch tracks require the sensor to be at 60 μm from the stripe.

If the distance between the magnetic reader sensor and the magnetic strip 100 is higher than the pitch of the magnetic elements 102, the magnetic reader sensor may not be able to pick up the magnetic field 101 generated by each magnetic element 102 on the magnetic strip 100.

Minimizing the distance between the magnetic reader sensor and the magnetic stripe increases the signal amplitude and reduces the overlapping (or cross-talk) between the magnetic fields of each magnetic element 102.

SUMMARY

The present disclosure concerns an magnetic reader (MR) sensor device for reading magnetic stripes, the MR sensor device comprising a substrate provided on a wafer, a back-end-of-line (BEOL) interconnect layer and a plurality of magneto-resistive sensor elements embedded within the BEOL interconnect layer; wherein the MR sensor device comprises a protective layer having a Vickers hardness of at least 3 GPa.

The present disclosure further concerns a method for manufacturing the MR sensor device, comprising:
  providing a wafer;
  forming a substrate on the wafer;
  forming at least one BEOL interconnect layer over the substrate;
  forming at least one magnetic reader sensor device comprising a plurality of magneto-resistive sensor elements embedded within at least one BEOL interconnect layer; and
  forming a protective coating layer over the BEOL interconnect layer; wherein the protective coating layer has a Vickers hardness of at least 3 GPa.

Preferably, the MR sensor device is formed and tested before forming the protective layer.

The protective layer can comprise a DLC (i.e. Diamond Like Carbon) layer.

In an embodiment, the protective layer has a friction coefficient μ that is lower than 1 and preferably lower than 0.5.

In an embodiment, the protective layer has a wear rate below $10^{-7}$ $mm^3$ $N^{-1}$ $m^{-1}$.

The MR sensor device can be brought to a distance of 20 μm or lower, to the surface to the magnetic stripe so that the magnetic stripe can be read with an increased resolution. The protective layer can withstand the lifetime of the device and the standard test of more than 1 million credit card swipes.

In another embodiment, the MR sensor device's package comprises a chamfered profile. The chamfered profile allows for integrating the MR sensor device into a mechanical setup that allows for easy swiping of the card. For example, chamfered edges are introduced to avoid hitting against the package epoxy.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
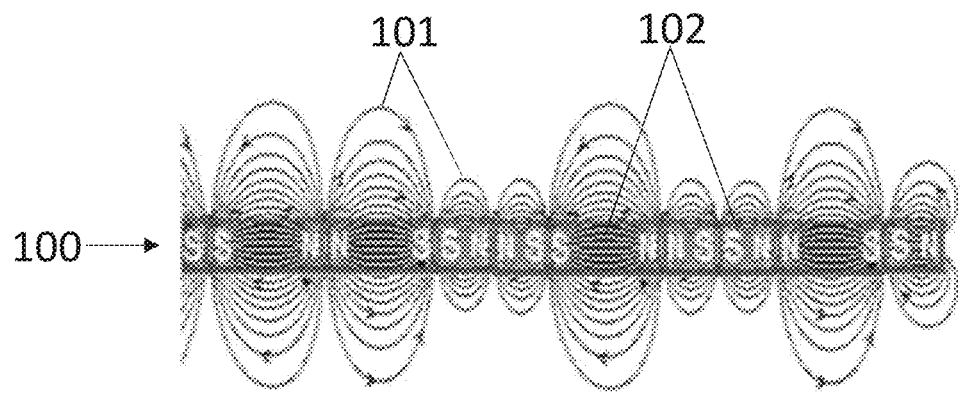
FIG. 1 is a cross section view of a magnetic stripe showing the magnetic fields generated.
Figure 2:
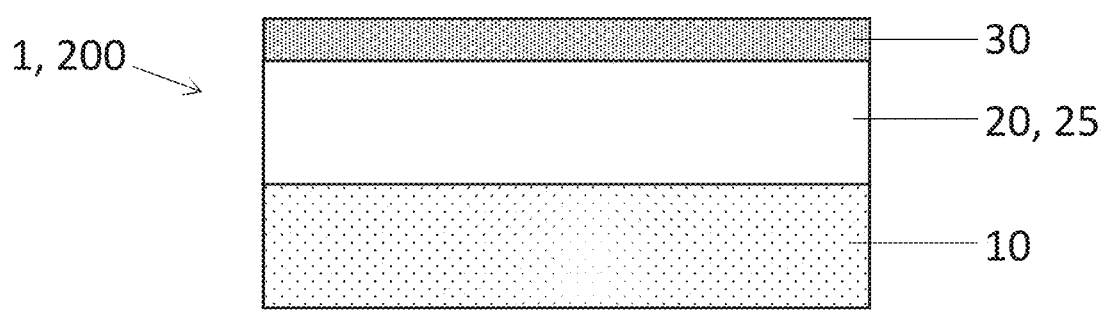
FIG. 2 shows a partial and schematic representation of a MR sensor device comprising magneto-resistive sensor elements, according to an embodiment.

FIG. 2 shows a partial and schematic representation of a magnetic reader (MR) sensor device 1 according to an embodiment. The MR sensor device 1 comprises a wafer 200 comprising a substrate 10, a back-end-of-line (BEOL) interconnect layer 20 and a MR sensor circuit comprising a plurality of magneto-resistive sensor elements 25 embedded within the BEOL interconnect layer 20. The MR sensor device 1 can comprise a portion of the wafer 200, or die, containing said back-end-of-line (BEOL) interconnect layer 20 and MR sensor circuit. The MR sensor device 1 is configured for reading the information stored on a magnetic strip and outputting a read signal.

Figure 3:
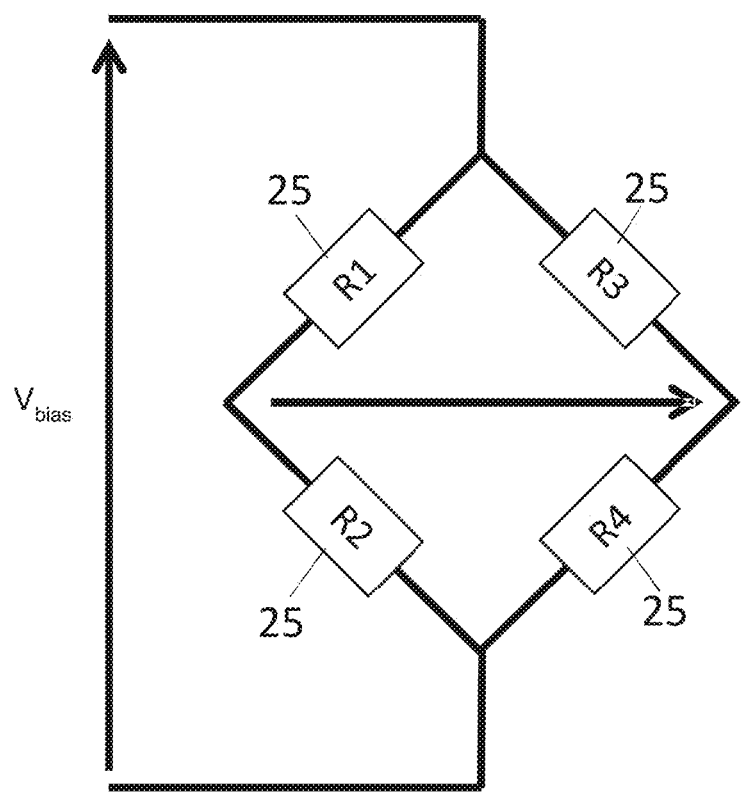
FIG. 3 shows a possible configuration of the magneto-resistive sensor elements.

FIG. 3 shows a possible configuration of the MR sensor circuit comprising magneto-resistive sensor elements 25, being connected according to a Wheatstone (full-bridge) configuration. In this configuration, a read signal can be measured between the node formed between the magneto-resistive sensor elements 25 R1 and R2 and the node formed between the magneto-resistive sensor elements 25 R3 and R4 (measurement diagonal). The value of the read signal depends on the ratio of the resistances R1:R2 and R4:R3 of the magneto-resistive sensor elements 25. Of course, other series and/or parallel arrangements are possible including half-bridge configuration.

The magneto-resistive sensor elements 25 can comprise a hall effect sensor. Alternatively, the magneto-resistive sensor elements 25 can comprise a xMR sensor, i.e., any one of or a combination of: an anisotropic magneto-resistance (AMR), giant magneto-resistance (GMR) or magnetic tunneling junction (TMR)-based sensor.

The MR sensor device 1 can further comprise a processing module (not shown) configured for decoding the read signal and extracting binary data.

In the embodiment of FIG. 2, the MR sensor device 1 comprises a protective layer 30 having a Vickers hardness of at least 3 GPa. The protective layer 30 allows for bringing the magneto-resistive sensor elements 25 of the MR sensor device 1 as close as possible to the surface to the magnetic stripe so that the read signal has an increased resolution.

In an embodiment, the protective layer 30 has a friction coefficient µ that is lower than 1 and preferably lower than 0.5, for typical environmental conditions when using the MR sensor device 1 to read a magnetic stripe.

The protective layer 30 further has high wear resistance. More particularly, the protective layer 30 can have a wear rate being below $10^{-7}$ mm$^3$ N$^{-1}$ m$^{-1}$.

In a preferred embodiment, the protective layer 30 comprises a diamond-like carbon (DLC) layer.

Here the DLC layer 30 can comprise a range of different types of amorphous carbon layer. In particular, the DLC layer 30 can comprise hydrogen-free DLC, a-C, hydrogenated DLC, a-C:H, tetrahedral amorphous carbon, ta-C, hydrogenated tetrahedral amorphous carbon, ta-C:H, and DLC containing dopants of either silicon or metal such as Si-DLC and Me-DLC respectively.

The DLC layer possess high Vickers hardness, low coefficients of friction against materials such as steel, and they are generally chemically inert. These desirable tribological properties arise as the properties of the layer can be manipulated to give either diamond-like or graphite-like properties by controlling the deposition process. Additionally, the incorporation of nitrogen, hydrogen, silicon or metal-doping gives further possibilities of controlling the chemistry, and thus the tribochemistry of the films.

Alternatively, the protective layer 30 can comprise a ceramic or any suitable material having a Vickers hardness of at least 3 GPa, possibly a coefficient µ that is lower than 1 and preferably lower than 0.5 and possibly a wear rate being below $10^{-7}$ mm$^3$ N$^{-1}$ m$^{-1}$.

The protective layer 30 further plays a role in protecting mechanically and chemically the MR sensor device 1 from the external environment. The protective layer 30 can thus extends the lifetime of the MR sensor device 1. For example, the MR sensor device 1 can easily withstands the standard test of more than 1 million credit card swipes while being put very close (less than 60 µm away) to the magnetic stripe.

Figure 4:
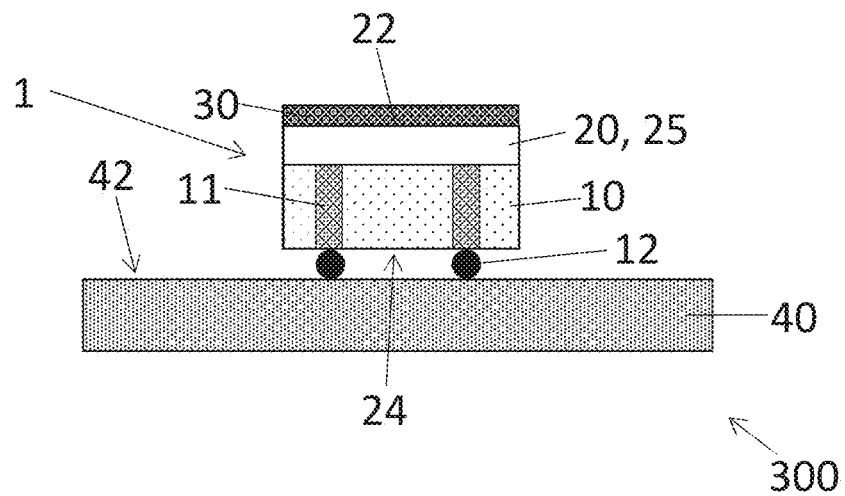
FIG. 4 illustrates the MR sensor device interconnected to a packaging substrate, according to an embodiment.

According to an embodiment shown in FIG. 4, the MR sensor device 1, or MR sensor die 1, is further interconnected to a packaging substrate 40 such as to form a packaged MR sensor device 300.

The MR sensor die 1 can comprise vias 11 passing completely through the substrate 10. Such vias 11 are often called through-silicon vias or through-hole contacts. The MR sensor die 1 can further comprise solder balls 12 on the lower face 24 of the wafer 200 and in connection with the vias 11. The vias 11 and the solder balls 12 provide interconnection between the MR sensor die 1 and the package substrate 40.

Figure 6:
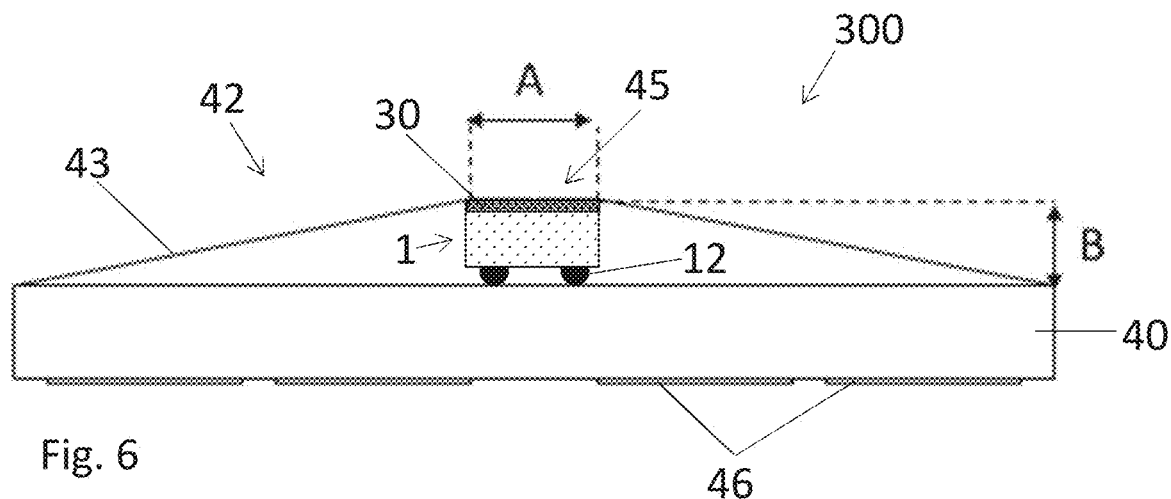
FIG. 6 shows the MR sensor device, according to another embodiment.

In another embodiment shown in FIG. 6, the packaged MR sensor device 300 comprises a chamfered profile 43 on the top face 42 of the package 40. The width "A" of a flat portion 45 of the top face 42 chamfered profile 43 is the same as the width of the MR sensor die 1 inside the package and "B" represents the total thickness of the MR sensor die 1 including the solder balls 12 and the protective layer 30. Bottom pads 46 are visible on the face of the package substrate 40 opposite to the one where the solder balls 12 are interconnected to the package substrate 40.

When a card is swiped, the chamfers allow for a smoother swipe. Whereas the 90° corners of a standard package will either stop the swiping action or damage the card's stripe.

Figure 7:
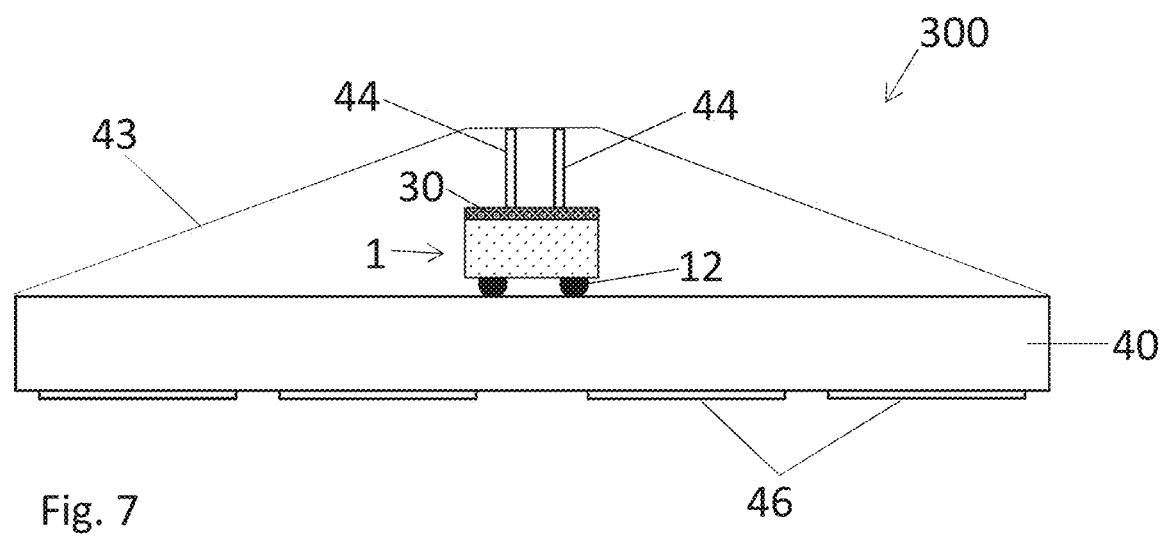
FIG. 7 shows the MR sensor device, according to another embodiment.

In another embodiment shown in FIG. 7, the packaged MR sensor device 300 comprises at least one magnetic flux concentrator 44 (in the example of FIG. 7, the packaged MR sensor device 300 comprises two magnetic flux concentrators 44). The magnetic flux concentrator 44 allows for reducing further the distance between the MR sensor device 1 and the magnetic strip, relaxing the constraint for the MR sensor device 1 to be as flush as possible with the top of the package.

Indeed, the MR sensor 1 needs to be flush with the top of the package, allowing the magneto-resistive sensor elements 25 inside the MR sensor die 1 to capture the magnetic field generated by the magnetic stripe 100. In the embodiment of FIG. 7, the magnetic flux concentrator (or magnetic flux guide) 44 made of soft ferromagnetic alloy (such as mu-metal) can be used to channel the magnetic field of the stripe 100 towards the MR sensor die 1. Thus, this configuration avoids the need to have the MR sensor die 1 flush with the top of the package (such as in FIG. 6 where the MR sensor die 1 is flush with the flat portion 45). In FIGS. 6 and 7, the BEOL interconnect layer 20 and magneto-resistive sensor elements 25 are not shown.

Figure 8:
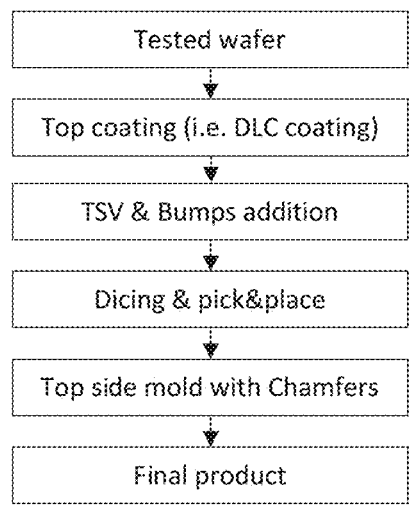
FIG. 8 shows the steps of a method for manufacturing the MR sensor device, according to an embodiment.

FIG. 8 shows steps of a method for manufacturing the MR sensor device 1, according to an embodiment. The method comprises the steps of:

providing a wafer 200;

forming a substrate 10 on the wafer 200;

forming at least one back-end-of-line (BEOL) interconnect layer 20 over the substrate 10; and forming at least one MR sensor circuit comprising a plurality of magneto-resistive sensor elements 25 embedded within at least one BEOL interconnect layer 20.

The method further comprises forming the protective layer 30 over the BEOL interconnect layer 20. The protective layer 30 has a Vickers hardness of at least 3 GPa.

In a preferred embodiment, the protective layer 30 comprises a DLC layer and the DLC layer 30 is deposited using any suitable deposition method, such as physical vapor deposition (PVD) or chemical vapor deposition (CVD). The DLC layer can be deposited at room temperatures.

In an embodiment, the thickness of the protective layer 30 ranges from few nanometers to 1 micrometers and more particularly, from 1 nm to 1 μm.

In another embodiment, the protective layer 30 comprises a ceramic or any suitable material having a Vickers hardness of at least 3 GPa.

The protective layer 30 comprises any suitable material having a Vickers hardness of at least 3 GPa and that can be deposited at low enough temperatures such as to not damage the other integrated circuit parts, namely the BEOL interconnect layer 20 and the magneto-resistive sensor elements 25 embedded within said at least one BEOL interconnect layer 20. For example, the protective layer 30 comprises any suitable material having a Vickers hardness of at least 3 GPa and that can be deposited at a temperature near room temperatures and below 300° C.

In an embodiment, the MR sensor device 1 and the processing module are formed on the wafer 200.

The plurality of magneto-resistive sensor elements 25 embedded within at least one BEOL interconnect layer 20 can be formed close to the surface of the wafer 200. The plurality of magneto-resistive sensor elements 25 can be arranged in rows along a first (x) direction and columns along a second (y) direction (not shown).

The method can then further comprise a step of dicing the wafer 200 to obtain individual MR sensor dices 1, each containing at least one MR sensor circuit. The dicing step can be achieved by mechanical sawing or other suitable techniques.

The method can further comprise a step of picking & placing each MR sensor die 1 on the packaging substrate 40 such as to form a packaged MR sensor device 300.

The method can further comprise a step of providing interconnections between the MR sensor die 1 comprising the at least one magnetic reader sensor device 1, and the packaging substrate 40.

Providing interconnections can be conventionally performed by using a wire bonding technique wherein bonding wires 23 (see FIG. 5) connect wire bond pads 21, located on the top face 22 of the wafer 200 (die 1), i.e., the face opposed to the lower face 24 in contact with the substrate 10, and the package substrate 40. The wire bonding technique adds several micrometers, typically 20 μm, to the distance between the top face 22 of the wafer 200 (die 1) to the top face 42 of the package substrate 40. Moreover, the protective layer 30 covering the top side 22 of the wafer 200 (die 1) would require providing contact access to the top pads through or within the protective layer 30, rendering the interconnection fabrication more complex.

Referring to FIG. 4t, the step of providing interconnections comprises forming vias (through-silicon vias or through-hole contacts) 11 passing completely through the substrate 10. The step of forming vias 11 is preferably performed on the wafer 200.

The method can comprise forming solder balls 12 on the lower face 24 of the wafer 200 and in connection with the vias 12.

The steps of dicing the wafer 200 to obtain individual dices 1 and the step of picking & placing each die 1 on the packaging substrate 40 can then be performed after the vias 11 and solder balls 12 have been formed.

The solder balls 12 are used to allow bonding and interconnecting the die 1 to the package substrate 40 after performing a reflow process.

Figure 9:
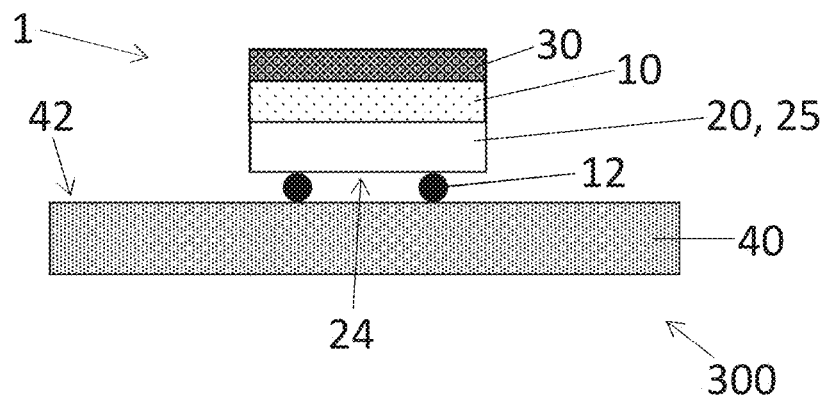
FIG. 9 illustrates the MR sensor device interconnected to a packaging substrate using flip-chip method, according to an embodiment.

In another embodiment shown in FIG. 9, the MR sensor die 1 comprise solder balls 12 on the BEOL interconnect layer 20. The solder balls 12 provide interconnection between the MR sensor die 1 and the package substrate 40, such as to form a packaged MR sensor device 300.

In the configuration in FIG. 9, the substrate 10 is between the protective layer 30 and the BEOL interconnect layer 20. This is in contrast with the MR sensor die 1 of FIG. 4, where the BEOL interconnect layer 20 is between the substrate 10 and the protective layer 30.

In order to achieve the configuration of FIG. 9, the step of providing interconnections comprises forming solder balls 12 on the BEOL interconnect layer 20. The method further comprises a step of flip-chip wherein, after the solder balls 12 are formed the MR sensor die 1 is turned upside down (flipped) on the package substrate 40 such that the solder balls 12 contact the package substrate 40. The BEOL interconnect layer 20 is thus closer to the package substrate 40 than the substrate 10. The protective layer 30 is then formed on top of the substrate 10 after flipping the MR sensor die 1.

In the configuration of FIG. 9, the thickness of the substrate 10 is determined by the pitch of the of the magnetic elements 102 on the magnetic stripe 100. For an ISO 7816 credit card, track 2 of the magnetic stripe is 75 bit/in, the substrate thickness can be about 100 μm without loss of resolution, while track 1 and 3 are 210 bit/in, the thickness of the substrate 10 should be smaller than about 40 μm, we found a thickness of about 20 μm to give the best results. To that end, the method can comprise a step of thinning the substrate 10, prior to forming the protective layer 30. The step of thinning the substrate 10 can be performed before of after the soldering the MR sensor die 1 with the solder balls 12 to the package substrate 40.

Figure 5:
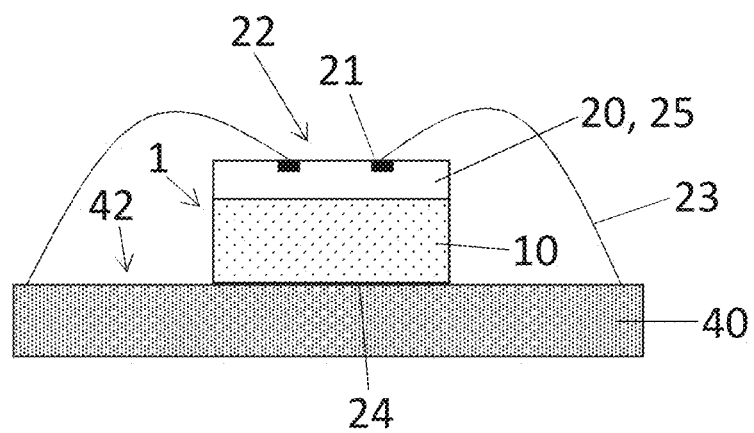
FIG. 5 illustrates a conventional wire bonding between the MR sensor device and the packaging substrate.

In another embodiment, the method comprises using a custom mold to provide a chamfered profile 43 on the top face 42 of the package 40 (see FIG. 5). The chamfered profile 43 allows for better integration of the MR sensor device in a point of sale terminal where credit cards are scanned for monetary transactions. The chamfered profile 43 allows for easing the swiping of the (card) magnetic stripe in the MR sensor device 1.

Equivalent embodiments involve a step sequence different from the one suggested above, though obtaining the same technical effect.

REFERENCE NUMBERS AND SYMBOLS

1 MR sensor device, MR sensor die
10 substrate
100 magnetic stripe
101 magnetic field
102 magnetic element
11 through-hole contact
12 solder ball
20 BEOL interconnect layer
21 bond pad
22 top face of the wafer
23 bonding wire
24 lower face of the wafer
25 MR sensor element
26 magnetoresistive element
30 protective layer
40 packaging substrate 41 chamfered shape
42 top face of the package
43 chamfered profile
44 magnetic flux concentrator
45 flat portion
46 bottom pad
300 packaged MR sensor device
200 wafer

The invention claimed is:

1. A magnetic reader (MR) sensor device for reading magnetic stripes, the MR sensor device comprising:
   a substrate provided on a wafer;
   a back-end-of-line (BEOL) interconnect layer;
   a plurality of magneto-resistive sensor elements embedded within the BEOL interconnect layer; and
   a protective layer having a Vickers hardness of at least 3 GPa,
   wherein the protective layer is on the BEOL interconnect layer.

2. The MR sensor device according to claim 1, wherein the protective layer has a friction coefficient µ that is lower than 1.

3. The MR sensor device according to claim 1, wherein the protective layer has a friction coefficient µ that is lower than 0.5.

4. The MR sensor device according to claim 1, wherein the protective layer has a wear rate below 10−7 mm3 N−1 m−1.

5. The MR sensor device according to claim 1, wherein the protective layer comprises a diamond like carbon (DLC) layer.

6. The MR sensor device according to claim 1, wherein the MR sensor device is interconnected to a packaging substrate.

7. The MR sensor device according to claim 6, comprising solder balls providing interconnection between the MR sensor device and the packaging substrate.

8. The MR sensor device according to claim 7,
   wherein the BEOL interconnect layer is between the substrate and the protective layer; and
   wherein the MR sensor device comprises vias passing through the substrate such that the vias and the solder balls provide interconnection between the MR sensor device and the packaging substrate.

9. The MR sensor device according to claim 7,
   wherein the BEOL interconnect layer is between the protective layer and the substrate; and
   wherein the solder balls are between the substrate and the package substrate.

10. The MR sensor device according to claim 1, further comprising a chamfered profile.

11. The MR sensor device according to claim 1, further comprising a magnetic flux concentrator.

12. A method for manufacturing a magnetic reader (MR) sensor device comprising a substrate provided on a wafer, at least one back-end-of-line (BEOL) interconnect layer, a plurality of magneto-resistive sensor elements embedded within the at least one BEOL interconnect layer, and a protective layer having a Vickers hardness of at least 3 GPa; the method comprising:
   providing the wafer;
   forming the substrate on the wafer;
   forming at least one BEOL interconnect layer;
   forming at least one MR sensor circuit comprising the plurality of magneto-resistive sensor elements embedded within at least one BEOL interconnect layer; and
   forming the protective layer having a Vickers hardness of at least 3 GPa on the BEOL interconnect layer.

13. The method according to claim 12, wherein forming the protective layer comprises forming a diamond like carbon (DLC) layer.

14. The method according to claim 13, wherein the protective layer is between 1 nm and 1 µm in thickness.

15. The method according to claim 12, further comprising dicing the wafer to obtain individual dices, each die containing a MR sensor circuit.

16. The method according to claim 15, further comprising
   placing at least one of the dices on a packaging substrate; and
   providing interconnections between the at least one BEOL interconnect layer of one of the dices and the packaging substrate.

17. The method according to claim 16, wherein said providing interconnections comprises forming solder balls on the MR sensor device.

18. The method according to claim 17,
   wherein said at least one BEOL interconnect layer is formed over the substrate and the protective layer is formed over said at least one BEOL interconnect layer; and
   wherein said providing interconnections further comprises providing through-silicon vias in the substrate such that the vias and the solder balls provide interconnection between the MR sensor device and the packaging substrate.

19. The method according to claim 17,
   wherein the at least one BEOL interconnect layer is formed between the protective layer and the substrate; and
   wherein the solder balls are formed on the substrate.

20. The method according to claim 17, further comprising a step of flipping the MR sensor device on the packaging substrate after the solder balls are formed, and
   wherein the protective layer is formed on top of the substrate after flipping the MR sensor device.

21. The method according to claim 12, further comprising providing a chamfered profile to the packaging substrate.

* * * * *